United States Patent
Goyins et al.

(10) Patent No.: US 6,938,201 B2
(45) Date of Patent: Aug. 30, 2005

(54) ERROR DETECTION SYSTEM FOR A FIFO MEMORY

(75) Inventors: Gregg S. Goyins, Lincoln, CA (US); Narayan R. Ayalasomayajula, Sacramento, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 476 days.

(21) Appl. No.: 10/235,060

(22) Filed: Sep. 5, 2002

(65) Prior Publication Data

US 2004/0049726 A1 Mar. 11, 2004

(51) Int. Cl.[7] .............................................. G11C 29/00
(52) U.S. Cl. ...................................... 714/805; 714/824
(58) Field of Search ............................... 714/805, 807, 714/824

(56) References Cited

U.S. PATENT DOCUMENTS 4,363,125 A * 12/1982 Brewer et al. .............. 714/824
5,465,260 A   11/1995 Zook
5,671,237 A   9/1997 Zook
6,678,861 B1 * 1/2004 Jones et al. ................. 714/781

OTHER PUBLICATIONS

Ross N. Williams; CRC Tutorial entitled "A Painless Guide to CRC Error Detection Algorithms"; Aug. 19, 1993; 29 pgs.
J.K. Weil and D. Chun, "The Single Burst Error Detection Performance of Binary Cyclic Codes", IEEE Transactions on Communications, vol. 42, No. 1, Jan. 1994, pp. 11–13.
D. Chun and J.K. Weil, "Special Hardware for Computing the Probability of Undetected Error for Certain Binary CRC Codes and Test Results", IEEE Transactions on Communications, vol. 42, No. 10, Oct. 1994, pp. 2769–2772.

* cited by examiner

Primary Examiner—Stephen M. Baker

(57) ABSTRACT

An error detection system for detecting errors in data output from a FIFO memory includes a first CRC generator for receiving an inbound data stream and generating a first CRC value based on a data block in the inbound data stream. A device coupled to the first CRC generator selectively inputs the data block and the first CRC value into the FIFO. A second CRC generator generates a second CRC value based on the data block after being output from the FIFO in an outbound data stream. The second CRC value indicates whether the data block contains an error.

26 Claims, 3 Drawing Sheets

ERROR DETECTION SYSTEM FOR A FIFO MEMORY

THE FIELD OF THE INVENTION

The present invention generally relates to error detection systems, and more particularly to an error detection system for a First In First Out (FIFO) memory.

BACKGROUND OF THE INVENTION

In a First In First Out (FIFO) memory, data entered at the input appear at the output in the same order. Input and output in a FIFO are typically controlled by two separate clocks. FIFO's are typically used for buffering data. Some FIFO's are based on random access memory (RAM) technology, which is susceptible to both short term and long term errors.

In existing systems that employ FIFO memory elements, either no error checking of data flowing through the FIFO is provided, or a simple parity check of bits on a per word basis is used. With parity checking, when a data word is output from the FIFO, the parity of the data word is checked against an expected value (i.e., even or odd). If the data word does not match the expected parity value, an error is determined to have occurred. Although this method works for determining single bit errors, it does not always work well for determining multiple bit errors.

It is desirable to provide a more robust system for detecting data corruption in data streams passing through FIFO memory elements.

SUMMARY OF THE INVENTION

One form of the present invention provides an error detection system for detecting errors in data output from a FIFO memory. The system includes a first CRC generator for receiving an inbound data stream and generating a first CRC value based on a data block in the inbound data stream. A device coupled to the first CRC generator selectively inputs the data block and the first CRC value into the FIFO. A second CRC generator generates a second CRC value based on the data block after being output from the FIFO in an outbound data stream. The second CRC value indicates whether the data block contains an error.

DESCRIPTION OF THE PREFERRED EMBODIMENTS

In the following detailed description of the preferred embodiments, reference is made to the accompanying drawings, which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
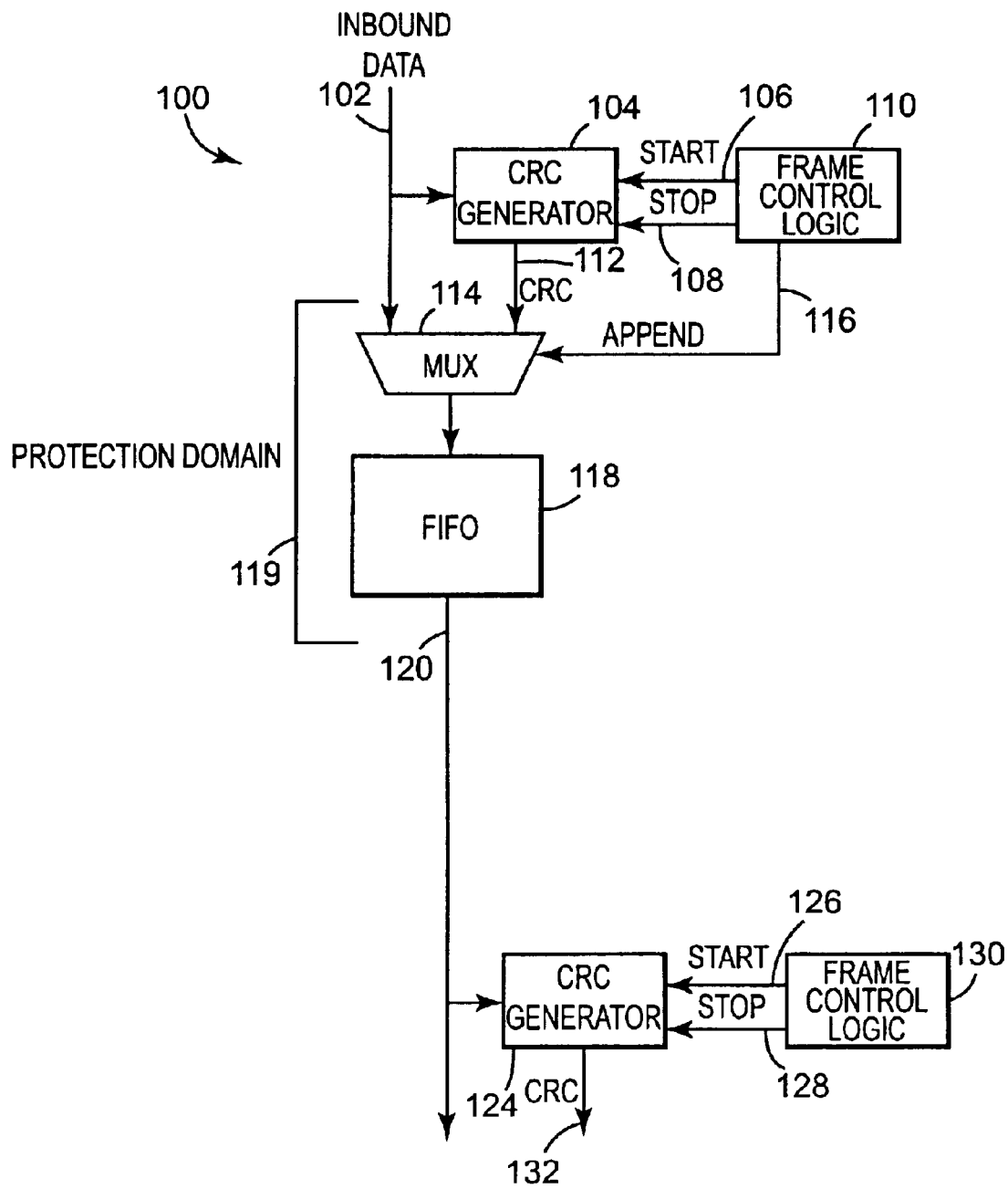
FIG. 1 is a block diagram illustrating a FIFO and an error detection system for detecting errors in data output from the FIFO according to one embodiment of the present invention.

FIG. 1 is a block diagram illustrating a First In First Out (FIFO) memory 118 and an error detection system 100 for detecting errors in data output from the FIFO 118 according to one embodiment of the present invention. Error detection system 100 includes cyclic redundancy code (CRC) generator 104, frame control logic 110, multiplexer (MUX) 114, CRC generator 124, and frame control logic 130. In one embodiment, error detection system 100 detects errors occurring in data passing through a protection domain 119, which includes multiplexer 114 and FIFO 118.

Inbound data stream 102 is received by CRC generator 104 and multiplexer 114. In one embodiment, inbound data stream 102 is a stream of binary values (e.g., 0 or 1). As the bits of inbound data stream 102 are received, CRC generator 104 begins accumulating a CRC value 112. In one embodiment, CRC value 112 is determined from the polynomial division shown in the following Equation I:

$$CRC = \text{remainder of } M[x]/G[x] \qquad \text{Equation I}$$

where:
M[x] is a message block (m-bits long) presented to the CRC generator 104; and
G[x] is a generator polynomial.

M[x] represents a block of data from inbound data stream 102. Frame control logic 110 controls the size of each block of data (message block) processed by CRC generator 104. Accumulation of a running CRC 112 begins when frame control logic 110 asserts start line 106, and ends when frame control logic 110 asserts stop line 108. The start and stop signals generated by frame control logic 110 delimit the data block to be checked. In one embodiment, an external controller (not shown) sends signals to frame control logic 110 that indicate when start line 106 and stop line 108 should be asserted.

M[x] is a polynomial representation of the bits in the message block, with each bit being a coefficient of the polynomial. An m-bit message block is regarded as a coefficient list for a polynomial with m terms, ranging from $x^{m-1}$ to $x^0$. Such a polynomial is said to be of degree m−1, with the highest order bit in the message block being the coefficient of $x^{m-1}$. For example, the message block "110001" has six bits, and M[x] for this stream of bits would represent a six term polynomial with coefficients 1, 1, 0, 0, 0, and 1: $x^5+x^4+x^0$.

For the generator polynomial, G[x], in Equation I, both the high order and the low order coefficients are 1. The generator polynomial G[x] is one bit longer than the desired bit length of the CRC 112. In one embodiment, G[x] is an international standard generator polynomial (e.g., CRC-12=$x^{12}+x^{11}+x^3+x^2+x^1+1$; CRC-16=$x^{16}+x^{15}+x^2+1$; or CRC-CCITT=$x^{16}+x^{12}+x^5+1$). Although a few examples of generator polynomial G[x] have been provided, the CRC 112 can be generated by any number of standard CRC algorithms that use a special polynomial divisor to produce a unique signature based on the content of a data block.

In one form of the invention, a "proper" generator polynomial G[x] has the following properties: (1) The probability of undetected error as a function of the bit error probability, p, never exceeds the probability of undetected error at p=0.5, which is 1−½$^n$*100%, or 99.9985% (for n=16), where n=the highest power in the generator polynomial (e.g., n=16 for the CRC-16 polynomial); and (2) the single burst error detecting performance is much larger (order of magnitude) than a non-proper polynomial, so n should chosen such that the number of bits in the message block M[x] to be checked does not exceed $2^n$, where n is the highest order term in the generator polynomial.

As mentioned above, M[x] and G[x] represent polynomials with binary coefficients. The polynomial arithmetic performed by CRC generator 104 is done Modulo 2 with no carry. The following Example I shows how polynomial division is performed according to one embodiment:

EXAMPLE I

| Message M: | 1101011011 |
| Message M after appending w bits: | 11010110110000 |
| Generator Polynomial G: | 10011 (width w = 4) |

```
              1100001010
10011 | 11010110110000
        10011
         10011
          10011
           00001
            00000
             00010
              00000
               00101
                00000
                 01011
                  00000
                   10110
                    10011
                     01010
                      00000
                       10100
                        10011
                         01110
                          00000
                           1110   >>> CRC
```

The above Example I does not take into account a seed value that might be used in certain implementations. It may be assumed for this Example I that the message M also incorporates a seed value. As shown in Example I, four binary zeros are appended to the end of the message M prior to division. The number of zeros that are appended on a message M is the same as the degree of the generator polynomial, which is four in Example I. The number of appended zeros also matches the width of the desired CRC 112. The CRC 112 is the remainder of the division M[x]/G[x], which is 1110 in Example I.

Once the CRC 112 has been calculated for a data block by CRC generator 104, in one embodiment, the CRC 112 is then appended to the data block with multiplexer 114. As shown in FIG. 1, multiplexer 114 includes a first input for receiving the inbound data stream 102, and a second input for receiving the CRC 112 from CRC generator 112. Multiplexer 114 initially outputs the message block from the inbound data stream 102 to FIFO 118. After outputting the message block, frame control logic 110 sends an append signal 116 to multiplexer 114, which causes multiplexer 114 to output the CRC 112 for the message block to FIFO 118.

FIFO 118 outputs an output data stream 120, which is analyzed by CRC generator 124. After passing through the FIFO 118, the message block with the appended CRC 112 in output data stream 120 is analyzed by CRC generator 124 to determine if the message block was corrupted. Frame control logic 130 asserts a start line 126 to indicate to CRC generator 124 the beginning of the message block, and asserts stop line 128 to indicate the end of the block. Accumulation of a CRC (e.g., remainder) 132 by CRC generator 124 begins when frame control logic 130 asserts start line 126, and ends when frame control logic 130 asserts stop line 128. In one embodiment, an external controller (not shown) sends signals to frame control logic 130 that indicate when start line 126 and stop line 128 should be asserted.

In one embodiment, CRC generator 124 validates the integrity of the received data block by dividing the received data block with the appended CRC 112 by the same generator polynomial G[x] that was used to generate the CRC 112, as represented by the following Equation II:

$$CRC = \text{remainder of } (M[x]+CRC)/G[x] \qquad \text{Equation II}$$

where:

M[x] is the message block presented to the CRC generator 124; and

G[x] is the generator polynomial that was used to generate the CRC 112.

In one form of the invention, system 100 is used to validate the integrity of data blocks where a CRC 112 is appended directly at the end of each data block. In this case, the polynomial G[x] is an exact multiple of the data block with the appended CRC 112, and the CRC 132 calculated by CRC generator 124 will be a constant number if no corruption occurred. If no corruption occurred, CRC 132 will be 0 if the appended CRC 112 is not inverted, but if the CRC 112 is inverted to provide additional error protection, the CRC 132 will be a distinct constant, or "magic" number that indicates that the data and embedded CRC 112 have passed through the FIFO 118 uncorrupted.

Figure 2:
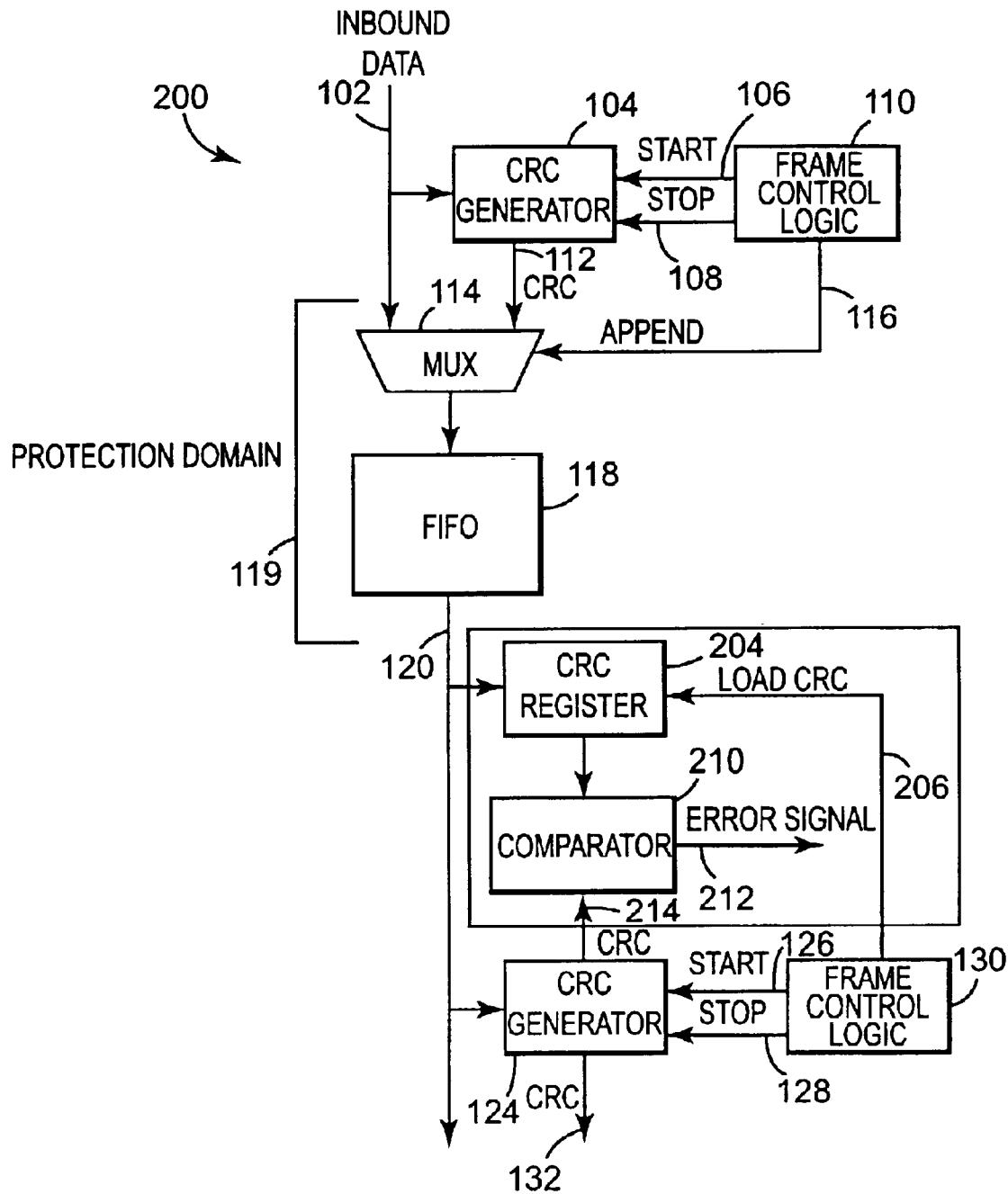
FIG. 2 is a block diagram illustrating a FIFO and an error detection system for detecting errors in data output from the FIFO according to an alternative embodiment of the present invention.

FIG. 2 is a block diagram illustrating a FIFO 118 and an error detection system 200 for detecting errors in data output from the FIFO 118 according to an alternative embodiment of the present invention. In one embodiment, system 200 may be used when CRC 112 is embedded in the message block, but not at the exact end of the message block. This case may occur if the FIFO 118 data output width is not the same as the data width on the inbound side, and padding is used (the padding bits are not included in the CRC).

In one embodiment, blocks 104, 110, 114, 118, 124, and 130, in FIG. 2 operate in substantially the same manner as described above with reference to FIG. 1. After passing through the FIFO 118, the message block with the appended CRC 112 in output data stream 120 is analyzed to determine if the message block was corrupted. The CRC 112 embedded in the message block is extracted from output data stream 120 and stored in CRC register 204. Frame control logic 130 (or an external controller) keeps track of the location of the CRC 112 in the message block, and outputs a "Load CRC" signal 206 to CRC register 204 at the appropriate time to load the CRC 112 from output data stream 120 into the register 204.

CRC generator 124 calculates a CRC 214 based on the received message block (without the embedded CRC 112) using the same generator polynomial G[x] that was used by CRC generator 104 to generate the CRC 112. Frame control logic 130 outputs a start signal 126 to CRC generator 124 to indicate the beginning of the message block, and outputs a stop signal 128 to indicate the end of the block. Accumulation of a CRC 214 begins when frame control logic 130 asserts start line 126, and ends when frame control logic 130 asserts stop line 128.

Comparator 210 receives the extracted CRC 112 from CRC register 204, and receives the newly calculated CRC 214 from CRC generator 124. Since the two CRC values 112 and 214 were generated from the same message block using the same generator polynomial P[x], the two values 112 and 214 should match if no error occurred in the message block as it passed through FIFO 118. Comparator 210 compares the two CRC's 112 and 214, and outputs an error signal 212 if the two values 112 and 214 are not equal. In one embodiment, system 200 is also configured to generate a CRC 132 in the same manner as described above with reference to FIG. 1, such as for data blocks having the CRC 112 appended at the end of the data blocks.

Figure 3:
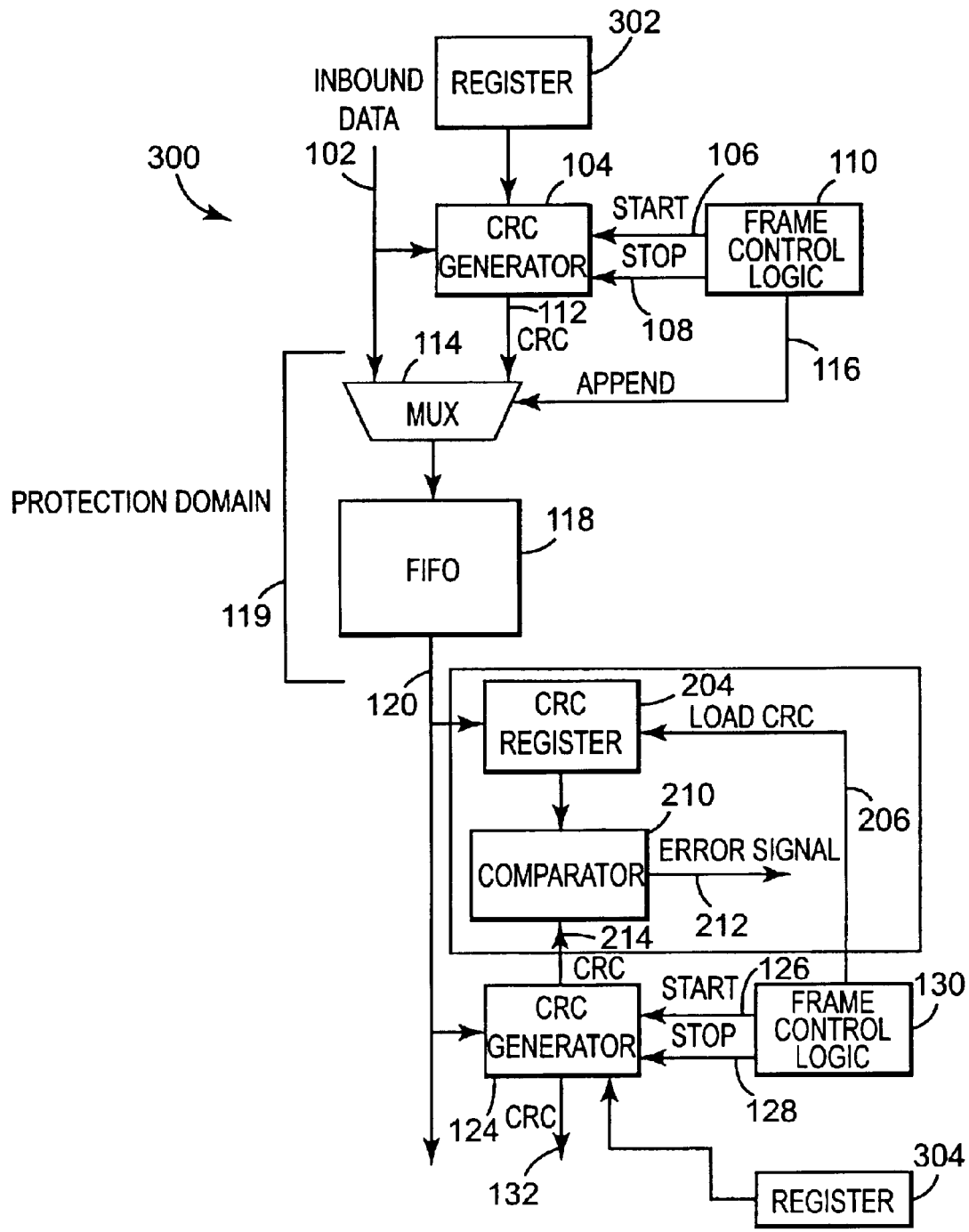
FIG. 3 is a block diagram illustrating a FIFO and an error detection system for detecting errors in data output from the FIFO according to another alternative embodiment of the present invention.

FIG. 3 is a block diagram illustrating a FIFO 118 and an error detection system 300 for detecting errors in data output from the FIFO 118 according to another alternative embodiment of the present invention. System 300 includes the same blocks 104, 110, 114, 118, 204, 210, 124, and 130, as system 200 shown in FIG. 2, and also includes registers 302 and 304. In one embodiment, registers 302 and 304 each store a plurality of different types of generator polynomials G[x]. In one embodiment, an appropriate generator polynomial G[x] is loaded into CRC generator 104 from register 302, and the same generator polynomial is loaded into CRC generator 124 from register 304. CRC calculations are then performed as described above using the generator polynomial loaded from registers 302 and 304.

In one form of the invention, the generator polynomials G[x] used by CRC generators 104 and 124 are changed "on the fly" during operation of system 300 to provide varying error detection properties. In one embodiment, the various generator polynomials G[x] stored in registers 302 and 304 have different properties (e.g., different lengths, different coefficients, etc.). As is known to persons of ordinary skill in the art, certain types of generator polynomials are better able to detect certain classes of errors than other generator polynomials. In addition, longer polynomials may be needed to accurately detect errors in longer blocks of data, while shorter polynomials may be used for shorter blocks of data. In one form of the invention, appropriate generator polynomials G[x] are automatically loaded from registers 302 and 304 into CRC generators 104 and 124, respectively, based on the length of data blocks that are to pass through FIFO 118, and/or based on the content of such data blocks or types of errors desired to be detected.

It will be understood by a person of ordinary skill in the art that functions performed by systems 100, 200, and 300 may be implemented in hardware, software, firmware, or any combination thereof. The implementation may be via a microprocessor, programmable logic device, or state machine. Components of the present invention may reside in software on one or more computer-readable mediums. The term computer-readable medium as used herein is defined to include any kind of memory, volatile or non-volatile, such as floppy disks, hard disks, CD-ROMs, flash memory, read-only memory (ROM), and random access memory.

In one embodiment, the CRC calculations performed by systems 100, 200, and 300, for both inbound 102 and outbound 120 sides of the data path happen in parallel with the shifting of data into the data path, so no latency penalty is imposed.

One embodiment of the present invention provides a robust system for detecting data corruption in data streams flowing through a FIFO using a CRC algorithm. Unlike conventional FIFO error detection processes based on parity, embodiments of the present invention can detect multiple bit errors, and can detect errors in blocks of data of varying sizes, rather than detecting errors only on a per word basis. Embodiments of the present invention are far more robust than existing parity-based error detection systems in terms of ability to detect various types of bit errors that may occur in data blocks that pass through a FIFO.

Although specific embodiments have been illustrated and described herein for purposes of description of the preferred embodiment, it will be appreciated by those of ordinary skill in the art that a wide variety of alternate and/or equivalent implementations may be substituted for the specific embodiments shown and described without departing from the scope of the present invention. Those with skill in the chemical, mechanical, electromechanical, electrical, and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. An error detection system for detecting errors in data output from a FIFO memory, the system comprising:
    a first CRC generator for receiving an inbound data stream and generating a first CRC value based on a data block in the inbound data stream;
    a device coupled to the first CRC generator for selectively inputting the data block and the first CRC value into the FIFO; and
    a second CRC generator for generating a second CRC value based on the data block after being output from the FIFO in an outbound data stream, the second CRC value indicating whether the data block contains an error.

2. The error detection system of claim 1, and further comprising:
    at least one controller for identifying a beginning and ending point of the data block within the inbound data stream and within the outbound data stream.

3. The error detection system of claim 1, wherein the first CRC generator is configured to generate the first CRC value by dividing the data block by a generator polynomial, and wherein the first CRC value represents a remainder of the division.

4. The error detection system of claim 1, wherein the device for selectively inputting is a multiplexer.

5. The error detection system of claim 1, wherein the second CRC generator is configured to generate the second CRC value by dividing the data block and the first CRC value by a generator polynomial, and wherein the second CRC value represents a remainder of the division.

6. The error detection system of claim 1, wherein the second CRC generator is configured to generate the second CRC value by dividing the data block by a generator polynomial, and wherein the second CRC value represents a remainder of the division.

7. The error detection system of claim 6, and further comprising:
    a comparator for comparing the first CRC value and the second CRC value, the comparator configured to identify that the data block includes an error if the first CRC value does not equal the second CRC value.

8. The error detection system of claim 1, and further comprising:
    at least one storage device for storing a plurality of different generator polynomials, the at least one storage device configured to load a selected one of the plurality of generator polynomials into the first and the second CRC generators for generating the first and the second CRC values.

9. A method of detecting errors in a data stream passing through a FIFO memory, the FIFO including an input for receiving an inbound data stream and an output for outputting an outbound data stream, the method comprising:
  identifying a data block in the inbound data stream;
  calculating a first CRC value based on the identified data block;
  storing the data block and the first CRC value in the FIFO;
  identifying the data block in the outbound data stream;
  calculating a second CRC value based on the data block in the outbound data stream; and
  detecting whether the data block in the outbound data stream includes an error based on the second CRC value.

10. The method of claim 9, wherein the step of identifying a data block in the inbound data stream comprises:
  generating a start signal indicating a beginning point of the data block; and
  generating a stop signal indicating an ending point of the data block.

11. The method of claim 9, wherein the step of calculating a first CRC value comprises:
  dividing the identified data block by a generator polynomial, wherein the first CRC value represents a remainder of the division.

12. The method of claim 9, wherein the step of storing the data block and the first CRC comprises:
  inputting the data block and the first CRC value into a multiplexer;
  outputting the data block from the multiplexer into the FIFO;
  sending an append signal to the multiplexer after the data block has been output from the multiplexer; and
  outputting the first CRC value from the multiplexer into the FIFO based on the append signal.

13. The method of claim 9, wherein the step of identifying the data block in the outbound data stream comprises:
  generating a start signal indicating a beginning point of the data block; and
  generating a stop signal indicating an ending point of the data block.

14. The method of claim 9, wherein the step of calculating a second CRC value comprises:
  dividing the data block and the first CRC value by a generator polynomial, wherein the second CRC value represents a remainder of the division.

15. The method of claim 9, wherein the step of calculating a second CRC value comprises:
  dividing the data block by a generator polynomial, wherein the second CRC value represents a remainder of the division.

16. The method of claim 15, wherein the step of detecting whether the data block in the outbound data stream includes an error comprises:
  comparing the first CRC value and the second CRC value; and
  identifying that the data block includes an error if the first CRC value does not equal the second CRC value.

17. The method of claim 9, and further comprising:
  storing a plurality of different generator polynomials in a register;
  loading a selected one of the plurality of generator polynomials from the register to a CRC generator, wherein the CRC generator calculates the first CRC value using the selected generator polynomial.

18. An error detection system for detecting errors in data output from a FIFO memory, the FIFO including an input for receiving an inbound data stream and an output for outputting a corresponding outbound data stream, the system comprising:
  first CRC generating means for generating a first CRC value based on a data block in the inbound data stream;
  means for inputting the data block and the first CRC value into the FIFO; and
  second CRC generating means for generating a second CRC value based on the data block in the outbound data stream, the second CRC value providing a basis for determining whether the data block contains an error.

19. The error detection system of claim 18, and further comprising:
  means for identifying a beginning and an ending point of the data block within the inbound data stream and within the outbound data stream.

20. The error detection system of claim 18, wherein the first CRC generating means is configured to generate the first CRC value by dividing the data block by a generator polynomial, and wherein the first CRC value is a remainder of the division.

21. The error detection system of claim 18, wherein the second CRC generating means is configured to generate the second CRC value by dividing the data block and the first CRC value by a generator polynomial, and wherein the second CRC value is a remainder of the division.

22. The error detection system of claim 18, wherein the second CRC generating means is configured to generate the second CRC value by dividing the first data block by a generator polynomial, and wherein the second CRC value is a remainder of the division.

23. The error detection system of claim 22, and further comprising:
  means for comparing the first CRC value and the second CRC value, and identifying that the data block includes an error if the first CRC value does not match the second CRC value.

24. The error detection system of claim 18, and further comprising:
  means for storing a plurality of different generator polynomials, the means for storing configured to load a selected one of the plurality of generator polynomials into the first and the second CRC generating means to generate the first and the second CRC values.

25. The error detection system of claim 18, wherein the means for inputting comprises a multiplexer.

26. A computer readable medium having computer executable instructions for performing a method of detecting errors in a data stream passing through a FIFO memory, the FIFO including an input for receiving an input data stream and an output for outputting a corresponding output data stream, the method comprising:
  identifying a data block in the input data stream;
  generating a first CRC remainder based on the identified data block;
  inputting the data block and the first CRC remainder into the FIFO;
  identifying the data block in the output data stream;
  generating a second CRC remainder based on the data block in the output data stream; and
  identifying whether the data block contains an error based on the second CRC remainder.

* * * * *